(12) United States Patent
Vaingast

(10) Patent No.: US 8,200,444 B2
(45) Date of Patent: Jun. 12, 2012

(54) METHODS AND APPARATUS FOR MONITORING BATTERY CHARGE DEPLETION

(75) Inventor: Shay M. Vaingast, Ganei Tikva (IL)

(73) Assignee: AMS Research Corporation, Minnetonka, MN (US)

( * ) Notice: Subject to any disclaimer, the term of this patent is extended or adjusted under 35 U.S.C. 154(b) by 399 days.

(21) Appl. No.: 12/593,787

(22) PCT Filed: Mar. 30, 2007

(86) PCT No.: PCT/US2007/008207
§ 371 (c)(1),
(2), (4) Date: Sep. 29, 2009

(87) PCT Pub. No.: WO2008/121109
PCT Pub. Date: Oct. 9, 2008

(65) Prior Publication Data
US 2010/0114510 A1 May 6, 2010

(51) Int. Cl.
*G01R 21/00* (2006.01)
(52) U.S. Cl. .............. 702/62; 324/428; 702/61; 702/63
(58) Field of Classification Search .............. 702/60, 702/63, 64, 65, 66, 78, 80, 117, 124, 133, 702/61, 62; 324/428; 600/30; 606/151; 607/29, 32, 41, 122; 623/23.72
See application file for complete search history.

(56) References Cited

U.S. PATENT DOCUMENTS
4,556,061 A    12/1985   Barreras et al.

(Continued)

FOREIGN PATENT DOCUMENTS
DE           8506522.6 U1    6/1985

(Continued)

OTHER PUBLICATIONS

Yamamoto et al., "Optimal parameters for effective electrical stimulation of the anal sphincters in a child with fecal incontinence: preliminary report," Pediatr Surg Int (1993) 8:132-137.

(Continued)

*Primary Examiner* — John H Le
(74) *Attorney, Agent, or Firm* — Gregory L. Koeller; Kimberly K. Baxter

(57) ABSTRACT

A system includes an implantable battery, an implantable medical device powered by the battery, a first resistance, a second resistance, a first memory register and a second memory register. The implantable medical device has first and second current drain states. The first resistance is connected to the battery through a first current path when the device is in the first current drain state, wherein current is prevented from flowing through the first current path when the device is in the second current drain state. The second resistance is connected to the battery through a second current path when the device is in the second current drain state, wherein current is prevented from flowing through the second current path when the device is in the first current drain state. The first memory register is configured to store a cumulative first current drain state count indicative of total charge drawn from the battery when the device is in the first current drain state. The second memory register is configured to store a cumulative second current drain state count indicative of a total charge drawn from the battery when the device is in the second current drain state.

20 Claims, 3 Drawing Sheets

U.S. PATENT DOCUMENTS

| | | | |
|---|---|---|---|
| 5,444,378 A * | 8/1995 | Rogers | 324/428 |
| 5,652,502 A * | 7/1997 | van Phuoc et al. | 702/63 |
| 5,769,873 A | 6/1998 | Zadeh | |
| 6,243,607 B1 | 6/2001 | Mintchev et al. | |
| 6,612,977 B2 | 9/2003 | Staskin et al. | |
| 6,885,894 B2 | 4/2005 | Stessman | |
| 6,911,003 B2 | 6/2005 | Anderson et al. | |
| 7,613,516 B2 | 11/2009 | Cohen et al. | |
| 2002/0161382 A1 | 10/2002 | Neisz et al. | |
| 2003/0028232 A1 | 2/2003 | Camps et al. | |
| 2004/0039453 A1 | 2/2004 | Anderson et al. | |
| 2005/0277994 A1 | 12/2005 | McNamee et al. | |
| 2007/0021650 A1 | 1/2007 | Rocheleau et al. | |
| 2007/0260288 A1 | 11/2007 | Gross | |
| 2010/0076254 A1 | 3/2010 | Jimenez et al. | |

FOREIGN PATENT DOCUMENTS

| | | |
|---|---|---|
| WO | 0000082 A1 | 1/2000 |
| WO | 2006014971 A2 | 2/2006 |
| WO | 2007097994 A2 | 8/2007 |
| WO | 2008121109 A1 | 10/2008 |

OTHER PUBLICATIONS

Yamanishi et al., "Electrical Stimulation for Stress Incontinence", Int. Urogynecol J (1998) 9:281-290 Springer-Verlag London Ltd.

International Search Report and Written Opinion of PCT/US2007/008207, filed Mar. 30, 2007.

* cited by examiner

METHODS AND APPARATUS FOR MONITORING BATTERY CHARGE DEPLETION

CROSS-REFERENCE TO RELATED APPLICATION

This Application is a Section 371 National Stage Application of International Application No. PCT/US2007/008207, filed Mar. 30, 2007 and published as WO 2008/121109 A1 on Oct. 9, 2008.

FIELD

The present invention pertains to methods and apparatus for monitoring a battery of a device, particularly the battery of an implantable medical device, enabling estimation of the depletion of and/or the remaining battery charge and remaining battery life.

BACKGROUND

As stated in U.S. Pat. Nos. 6,671,552 and 6,901,293, a wide variety of implantable medical devices (IMDs) are commercially released or proposed for clinical implantation that are programmable in a variety of operating modes and are interrogatable using RF telemetry transmissions. Such IMDs include cardiac pacemakers, pacemaker/cardioverter/defibrillators, now referred to as implantable cardioverter-defibrillators (ICDs), cardiomyostimulators, other electrical stimulators including nerve and muscle stimulators, deep brain stimulators, and cochlear implants, drug delivery systems, cardiac and other physiologic monitors, and heart assist devices or pumps, etc. Such IMDs other than monitors and drug delivery systems comprise an implantable pulse generator (IPG) and one or more electrical medical lead coupled to a connector of the IPG bearing body signal sense and/or stimulation electrodes and/or physiologic sensors for detecting a condition of the body, a body organ or other body tissue. The IPG typically comprises a hermetically sealed housing enclosing at least one battery and electronic circuitry powered by the battery that processes input signals, provides electrical stimulation and communicates via uplink and downlink telemetry transmissions with an external medical device, typically a programmer that is capable of being used to alter an IPG operating mode or parameter. The current drawn from the battery or batteries varies in relation to the IPG operating state, e.g., during sensing or stimulating time periods.

Typical batteries used in powering IMDs other than the cardioversion/defibrillation shock delivery circuitry of ICDs comprise lithium-iodine batteries having discharge characteristics described in U.S. Pat. No. 6,167,309, for example, and lithium/carbon monofluoride batteries having discharge characteristics described in U.S. Pat. No. 6,108,579, for example. It is well known that a battery's internal impedance increases with time and usage resulting in a decrease in battery terminal voltage. The voltage drop across the battery's internal impedance, which tends to act like a voltage divider circuit, increases as the internal impedance increases. The decrease in terminal voltage eventually reaches a battery "end of life" (EOL) voltage that is insufficient to power the IMD. The discharge characteristics of batteries can be expressed by curves (or equations) of internal battery impedance as a function of expended battery capacity (in terms of charge).

As noted in the above-referenced '552 patent, typically IPGs and monitors are designed to monitor the level of battery depletion and to provide some indication when the depletion reaches a level at which the IPG or monitor should be replaced. For example, pacing IPGs typically monitor battery energy and depletion and develop an "elective replacement indicator" (ERI) when the battery depletion reaches a level such that replacement will soon be needed to avoid further depletion to the EOL voltage. Operating circuitry in the pacing IPG typically responds to issuance of an ERI by switching or deactivating operating modes to lower power consumption in order to maximize the ERI-to-EOL interval, referred to in certain instances as an elective replacement time (ERT) or recommended replacement time (RRT) during which the IPG or monitor should be replaced.

In the above-referenced '552 patent, the IPG periodically makes and stores battery voltage measurements and accumulates incident (stimulation) counts, sense and stimulation channel impedance measurements, and current drain indication data that is periodically uplink telemetry transmitted during a telemetry session to an external programmer for display and analysis. A complex process is followed in the external programmer to compute an estimated past current drain (EPCD). The EPCD is the estimated average current drain from the time of the most recent past computation to the present time of computation or a shorter time period. The programmer then computes a remaining life estimate (RLE, aka as the ERT) to EOL based on the average battery voltage and EPCD.

Alternative and simpler approaches to determining an ERT or to simply determine battery charge depletion have been proposed or implemented in IPGs over the years employing measurements of battery impedance and/or current drain and known battery characteristics.

As described in U.S. Pat. No. 6,748,273, monitoring the internal impedance of the battery and comparing it to characteristic battery impedance changes during discharge is considered to be a reliable way of determining the remaining capacity and ERT of the battery. However, certain fresh batteries exhibit a low, substantially constant, internal impedance a corresponding stable voltage for a comparatively long time, and it is difficult to perform reliable measurements of the small changes in internal impedance during this time. Further U.S. Pat. No. 5,370,668 discloses an IMD in which internal battery impedance measurements are combined with periodic assessments of the loaded terminal voltage of the battery to trigger an ERI and establish an ERT. The technique disclosed in the '668 patent is adapted particularly for rejecting transients in the battery's demand as criteria for triggering an ERI.

The '273 patent also indicates that from a theoretical point of view the ideal way of determining the remaining capacity of a battery would be measurement of the charge drawn from the battery as disclosed in U.S. Pat. Nos. 4,715,381, and 5,769,873, for example. In the above-referenced '273 patent, battery impedance is measured and an impedance-based value of the remaining capacity of the battery is determined from a detected impedance increase. An analysis of the battery impedance increase is performed to determine whether the battery impedance is a reliable indicator of the remaining battery capacity and, if not, the total charge depleted from the battery is measured, and a charge depletion-based value of the remaining capacity of the battery is determined.

In the '381 patent, an IPG battery test circuit is disclosed for quantifying the consumed charge from the number of stimulation pulses emitted and from the expended pulse charge. Other losses of current, like e.g. leakage currents, are not considered. The true remaining battery capacity could then be less than the estimated remaining capacity and consequently the remaining operation time could be overestimated.

In a further U.S. Pat. No. 5,193,538, the depletion of a pacemaker IPG battery is monitored to determine the ERT before battery voltage further depletes to the EOL voltage. The battery voltage is periodically compared to a reference or threshold voltage characterized as an ERT-value that is less than full battery voltage at beginning of life (BOL) and selected to provide an ERT of about three months to EOL. It is recognized that the rate of battery voltage depletion is dependent upon the rate at which battery charge or current is consumed in any given "stimulating mode", which appears to reference either or both of a pacing mode and pacing parameters in a given pacing mode. Stimulating modes may include a fixed rate pacing mode or a demand pacing mode of the types referenced in the Inter-Society Commission for Heart Disease Resource Code published by the *American Journal of Cardiology*, 34, 487, 1974 and those subsequently implemented in pacing, cardioversion, and defibrillation. In a given pacing mode, the rate of battery depletion depends on the physician programmed pacing parameters, including pulse voltage and pulse width as well as pacing rate, as well as the utilization or percentage of time that pacing is not inhibited when the patient's underlying heart rate exceeds the programmed pacing interval.

The solution proposed in the '538 patent appears to involve varying the ERT-value in dependence on the utilized stimulating mode and in dependence on the degree of utilization of previously selected stimulating modes recorded in and available from stimulating mode selector means. A higher threshold value is selected for stimulating modes with higher energy consumption and a higher degree of utilization and a lower threshold value is selected for stimulating modes with a lower energy consumption and a lower degree of utilization. Thus, an adaptation and stabilization of the ERT between the satisfaction of the ERT-value and the point in time of the EOL-value is achieved according to the utilized stimulating mode, which deviates from an assumed standard stimulating mode.

However, this solution requires current consuming, current sources or loads to establish the ERT-values and rather precise estimations of utilization or pace pulse counts to select the same to set a current ERT-value that may provide a relatively constant ERT to EOL. Also, current sources may not be stable over extended time periods.

In U.S. Pat. Nos. 4,556,061, 5,769,873 and 6,885,894, a measurement of charge depletion is provided not by measuring the voltage level or impedance of the pacemaker IPG battery, but rather by continuously measuring the electrical current drawn from the battery and integrating that measured current over an integration time period. A precision current-sensing resistor in series with the positive side of the battery provides a sense signal having a voltage that varies according to the magnitude of current being drawn during stimulation and sensing. The sense signal is integrated using a voltage-controlled oscillator (VCO) circuit and counter, which are implemented using CMOS circuitry arranged in a switched-capacitor topology. The VCO signal is in the form of a pulse sequence, where each pulse has a duration corresponding to a discrete quantity of depleted charge. The counter counts the VCO pulses to produce the measurement of the depleted charge.

The current drawn by the IPG circuitry of the '061, '873, and '894 patents varies as a function of the instantaneous operating state, and the voltage developed across the current-sensing resistor varies as a function of the current drawn by the pacing circuitry powered by the battery. The current passing through the current-sensing resistor in the interval between pacing pulses is relatively low, resulting in a relatively low voltage drop, and is relatively high during recharge of an output capacitor following its discharge to deliver a pacing pulse, resulting in a relatively high voltage drop. In order to operate the VCO during low current drain intervals between pacing pulses, it may be necessary to select a relatively high current-sensing resistor resistance. Then, during high current drain intervals, the voltage drop across the current-sensing resistor will reduce the voltage available to power the IPG circuitry. The reliability of circuit operations may become of concern during such high current drain intervals and as battery voltage depletes over time.

SUMMARY

The preferred embodiments of the present invention incorporate a number of inventive features that provide a simple and accurate measurement of charge depletion of a battery powering a device, e.g., an IMD, without itself unduly loading the battery while minimizing battery charge depletion.

In accordance with one embodiment of the present invention, a charge count circuit is incorporated in an IMD to provide a measure of the total charge that is drawn from the battery at any time between power-up of the IMD circuitry by the battery (battery BOL) to battery EOL from which an ERT can be calculated. The IMD is operable in a plurality of IMD operating states, which each impose a particular current-drain on the battery. The expressions "operating state" and "current drain state" may be used interchangeably herein.

Preferred embodiments of the present invention involve a system and method of monitoring the amount of charge consumed from the battery powering the IMD operable in at least first and second current drain states. In each current drain state, a resistance correlated to the current drain of the current drain state is connected with the battery to develop a respective current drain state voltage that is converted to a current drain state count of that current drain state over the state duration. The first and second current drain state counts are accumulated as cumulative first and second current drain state counts. The cumulative first and second current drain state counts are indicative of the amount of charge consumed from the battery. A battery charge state may be estimated from the cumulative first current drain state count and the first current state resistance and the cumulative second current drain state count and second current state resistance.

In preferred embodiments, each current drain state voltage is applied as an input to a voltage controlled oscillator (VCO) that generates a VCO output signal having a frequency related to the current drain state voltage. Preferably, the current drain state resistances are selected in light of VCO operating parameters to limit the dynamic range of the current drain state voltage applied to the VCO input. The VCO output signal is applied to a counter that increments a current drain state count for the duration of each current drain state. A cumulative current drain state count is stored and incremented by the count in the counter when the current drain state changes. The stored, cumulative current drain state counts of the current drain states are correlated to the charge depletion of the battery and may be employed either in the implantable or external medical device to estimate the total charge depletion and/or the remaining battery charge of the battery. Similarly, an ERT of the battery can be estimated either in the implantable or external medical device from the charge state of the battery, the average rate of charge depletion, and the known capacity and depletion characteristics of the battery. Advantageously, it is not necessary to keep records of the durations of the current drain states to employ in estimating total charge depletion.

The selected resistance for each current drain state maintains the current-sensing resistor voltage drop within a relatively narrow dynamic range tailored to the VCO, whereby the accuracy of measurement of current drawn from the battery is optimized, the current consumed in the process is minimized, and the battery voltage available to the operating circuitry of the IMD is not unduly decreased during high current drain states.

This summary of the invention has been presented here simply to point out some of the ways that the invention overcomes difficulties presented in the prior art and to distinguish the invention from the prior art and is not intended to operate in any manner as a limitation on the interpretation of claims that are presented initially in the patent application and that are ultimately granted.

BRIEF DESCRIPTION OF THE DRAWINGS

These and other advantages and features of the present invention will be more readily understood from the following detailed description of the preferred embodiments thereof, when considered in conjunction with the drawings, in which like reference numerals indicate identical structures throughout the several views, and wherein.

DETAILED DESCRIPTION OF THE PREFERRED EMBODIMENTS

In the following detailed description, references are made to illustrative embodiments of methods and apparatus for carrying out the invention. It is understood that other embodiments can be utilized without departing from the scope of the invention. Preferred methods and apparatus are described for IMDs adapted to be implanted in a patient's body and operable or interrogatable employing an external programmer.

Figure 1:
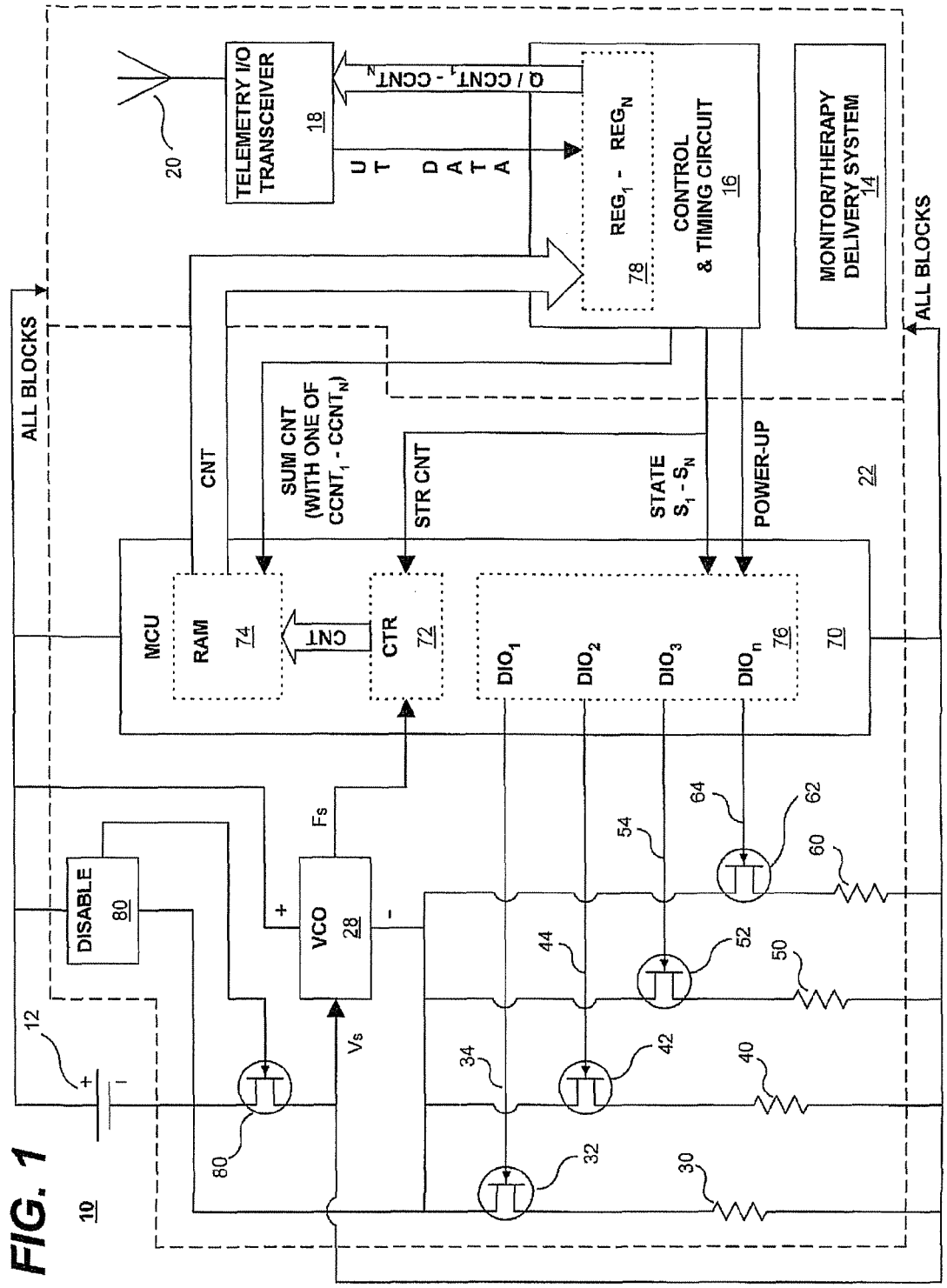
FIG. 1 is a simplified schematic diagram of a battery powered IMD having a charge count circuit operable in accordance with one embodiment of the present invention.

Thus, in reference to FIG. 1, a battery charge depletion monitor is depicted for monitoring the amount of charge delivered by a battery of an IMD operable in at least first and second current drain states or a plurality of drain states 1, 2, 3, ... n (where n=4 in this example). For simplicity of illustration, other circuitry and components of a typical IMD 10 that are not involved in the accumulation of battery charge counts for practice of the present invention are not depicted in detail in FIG. 1. Moreover, the IMD 10 is schematically depicted including discrete components and actual circuit traces for transfer of power and electrical signals as well as schematically depicted lines signifying commands or instructions and data buses signifying transfer of counts or data in order to describe the preferred embodiments of the invention. The actual implementation of the invention may take a variety of forms.

The portion of the circuitry and components of an IMD 10 functioning as the battery charge depletion monitor that is schematically depicted comprises the battery 12 and the monitor/therapy delivery system 14, which includes the control and timing circuit 16, the telemetry I/O transceiver 18, the telemetry antenna 20, the charge count circuit 22, and various signal lines and data buses extending therebetween. It will be understood that a typical IMD comprising a monitor or therapy delivery device delivering a drug or electrical stimulation includes a monitor/therapy delivery system 14. The monitor/therapy delivery system 14 may comprise the remaining circuitry and components of any monitor and/or IPG or drug dispenser of the types described above and one or more electrical medical lead or drug delivery catheter and/or physiologic sensor to constitute the IMD 10. An exemplary IPG 100 is more completely described below in reference to FIG. 2.

The control and timing circuit 16 may comprise a microcomputer or microcontroller and/or discrete logic circuitry and analog circuit components that control the delivery of a therapy and/or monitor physiologic conditions of the patient by the monitor/therapy delivery system 14 during discrete time periods or intervals of an operating cycle. The control and timing circuit 16 also responds to commands received from a programmer or other external medical device to change an operating mode or therapy delivery or sensing parameter. For purposes of practicing the preferred embodiment of the present invention, the control and timing circuit 16 includes RAM registers including registers $RAM_1$-$RAM_N$ employed with the charge count circuit 22 as described below. The control and timing circuit 16 also includes control circuits and timers for timing out the discrete time intervals of IMD operating states of a particular, typically programmed, mode of therapy delivery and/or monitoring.

Typically, the delivery of a therapy, e.g., electrical stimulation or a drug, and the monitoring of a physiologic condition is cyclic, such that the control and timing circuit 16 times out active state intervals of therapy delivery and/or powering and monitoring the output of a physiologic sensor and times out relatively inactive or quiescent state intervals between such active state intervals. For example, an operating cycle may be marked by the successive delivery of an electrical stimulation therapy comprising a stimulation pulse with quiescent and sensing intervals timed out therebetween. In certain IMDs, the stimulation therapy comprises a train of N stimulation pulses, each pulse separated by a capacitor recharge interval. The control and timing circuit 16 is programmed in an operating mode to time out the active and quiescent state intervals, trigger the actions in the active states, and perform self-test or housekeeping functions in the quiescent state. The intervals of these operating states may be parameters that are programmable employing an external programmer. Parameters of the therapy delivery that affect the charge drawn from the battery 12 may also be programmable by the external programmer.

The battery 12 supplies voltage and current to all circuits and powered components of the IMD 10 and discharges over successive cycles as a function of the current drain imposed on the battery during the active and quiescent states. Generally speaking, during each cycle, the current drain during delivery of a therapy (in the therapy state) exceeds that drawn during sensing (in the sensing state), and the current drain during sensing exceeds that drawn in the quiescent interval(s) (in the quiescent state(s)). The relatively high therapy state current drain during electrical stimulation is associated with the charging or recharging of the output capacitor that is discharged through electrodes of an electrical medical lead to stimulate body tissue.

In accordance with one embodiment of the present invention, the charge drawn from the battery 12 is measured during each current drain state 1 through N and stored as cumulative current drain state counts in respective registers $REG_1$ through $REG_N$ of RAM 78 between power-up of the IMD circuitry by the battery 12 to battery EOL. As described further below, the charge depletion or cumulative or total charge Q drawn from the battery may then be estimated from the cumulative current drain state counts, and an ERT may be optionally estimated. In one approach, the counts in registers $REG_1$ through $REG_N$ of RAM 78 may be uplink telemetry transmitted via telemetry I/O transceiver 18 to an external medical device, e.g., a physician operated programmer. The estimates of charge depletion Q and optionally the ERT may be calculated in the external medical device, displayed for the physician, and stored in patient records.

Alternatively, the estimates of the cumulative charge Q and optionally the ERT may be calculated periodically and maintained in memory within the control and timing circuit 16 for uplink telemetry transmission via telemetry I/O transceiver 18 to an external medical device, e.g., a programmer. Optionally, the patient may be provided with an external medical device that periodically communicates with the IMD 10 to retrieve the estimates of the cumulative charge Q and optionally the ERT and forward them over the internet, for example to a remote monitoring center in any of the ways known in the art.

In the exemplary embodiment depicted in FIG. 1, a charge count circuit 22 is incorporated in IMD 10 to provide current drain state counts to be added to the proper cumulative current drain state count in respective registers $REG_1$ through $REG_N$ of RAM 78 at each state change. The charge count circuit 22 comprises a resistance for each of the N current drain states that is selectively connected to a terminal of battery 12 and the input of a VCO 28 when the current drain state is entered, whereby a current drain state voltage $V_S$ is applied to the VCO input. It is desirable and advantageous to ensure that the current drain state voltage $V_S$ (also referred to as the VCO input voltage $V_S$) be maintained within a prescribed dynamic range for the VCO 28 and below a maximum voltage drop, so that the battery voltage available to the IMD circuitry remains above a minimum operating voltage.

In accordance with a preferred embodiment of the present invention, a plurality of current-sensing resistors are provided in charge count circuit 22, and a selected current sensing resistor is coupled to a battery terminal and the VCO input as a function of the operating state of the IMD 10. Thus, a plurality, e.g., four, current-sensing resistors 30, 40, 50, and 60 are depicted coupled in common to the input of VCO 28 and adapted to be selectively coupled by FET switches 32, 42, 52, and 62, respectively, to the negative terminal of battery 12. The battery 12 and the selected current-sensing resistor 30, 40, 50 or 60 are therefore in series with the remaining powered circuitry of the IMD 10.

The VCO power terminals are coupled across the positive and negative terminals of the battery 12. The selected current-sensing resistor voltage drop $V_S$ applied to the input of the VCO 28, and the VCO 28 generates a VCO output signal having a frequency $F_S$ proportional to the VCO input voltage $V_S$. The ratio between the frequency $F_S$ and the input voltage $V_S$ is fixed and can be characterized as the VCO's gain. The gain is fixed regardless of input voltage Vs, and regardless of terminal voltage, assuming it is within the VCO's specifications. For example, it may be shown that the VCO 28 generates an output signal having a frequency $F_{BAT}$ when the full battery terminal voltage $V_{BAT}$ is applied to the VCO input, and so the VCO gain may be characterized as Gain=$F_{BAT}/V_{BAT}$. In FIG. 1, the VCO output signal frequency $F_S$ depends on the input voltage $V_S$ across one of the resistors 30, 40, 50, 60 in a given current drain state. Thus, the VCO output signal frequency $F_S=V_S*$Gain=$V_S*F_{BAT}/V_{BAT}$ or $F_S=(I_S*R_S)/V_{BAT}$, where $I_S$ is the current through the resistance $R_S$. Furthermore, it can be shown that the VCO output signal frequency $F_S$ remains constant until battery EOL is reached since $F_S=V_s*$Gain, and the Gain is fixed until battery EOL.

A microcontroller unit (MCU) 70 is coupled between the output of VCO 28, the gates of FET switches 32, 42, 52 and 62, and the control and timing circuit 16. The MCU 70 comprises a counter 72, a RAM register 74 and a digital I/O switch network or multiplexor 76. The digital I/O switch network 76 has an input terminal for receiving a state change command and output terminals coupled via conductors 34, 44, 54, 64 to the respective gates of FET switches 32, 42, 52, 62. It will be understood that MCU 70 or parts of MCU, e.g., RAM register 74, may be integrated into the control and timing circuit 16 and vice versa.

The control and timing circuit 16 provides commands to the MCU 70, particularly each time that the IMD operating state changes following the initial power-up of the IMD 10 by the battery 12, which typically takes place in the final stages of manufacture. The control and timing circuit 16 includes one or more timer that times out operating states and issues state commands associated with changes in the operating states. The operating state commands may convey the current state or simply signify that the next state in the repetitive cycle of state changes is being entered. In the former case, the digital I/O switch network 76 decodes the state change command (STATE) and triggers the appropriate FET 32, 42, 52, 62 into conduction to connect the respective current-sensing resistor 30, 40, 50, 60 in series with the battery 12. In the latter case, the STATE command may simply toggle the digital I/O switch network 76 to trigger the next FET 32, 42, 52, 62 in the predetermined sequence of the cycle into conduction to connect the respective current-sensing resistor 30, 40, 50, 60 in series with the battery 12. In this way, the current-sensing resistor that is correlated to the current drain state is coupled in series between the negative terminal of battery 12 and the input of VCO 28 to provide the voltage drop $V_S$ to VCO 28.

In intervals between STATE commands, the current drain state count CNT in counter 72 increments with each VCO output pulse. A STR-CNT command is generated by control and timing circuit 16 in timed relation to the STATE command and applied to the counter 72 to transfer the current drain state count CNT in counter 72 to RAM register 74 and to reset the count in counter 72 to zero or a starting count. Similarly, a SUM-CNT command is generated by control and timing circuit 16 in timed relation to the STATE command to transfer the CNT to the one of the RAM registers $REG_1$ through $REG_N$ that sums and stores the summed values of each state count as cumulative current drain state counts $CCNT_1$ through $CCNT_N$. It will be understood that the timing and control circuitry 16 generates the appropriate SUM-CNT (WITH ONE OF $CCNT_1$-$CCNT_N$) command that routes the count CNT to the correct RAM register $REG_1$ through $REG_N$ for the operating state 1 through N. As noted above, these steps may be simplified such that the RAM register 74 is eliminated and the current drain state count CNT is directly summed with the correct one of the cumulative current drain state counts $CCNT_1$ through $CCNT_N$ upon a state change.

Thus, one of the current-sensing resistors 30, 40, 50, and 60 is coupled to a battery terminal as a function of the instantaneous IMD operating state, which dictates a corresponding current drain state. The VCO 28 converts the current-sensing resistor voltage drop to a count that is stored in counter 72 during each operating state. The count CNT in counter 72 is transferred to RAM 72 of MCU 70 upon each change in operating state The count CNT in RAM 74 is transferred to a RAM register in control and timing circuit 16 associated with each operating state. Counts $CCNT_1$-$CCNT_N$ accumulated in the RAM registers $REG_1$-$REG_N$ during each operating state can be employed to estimate the total charge depletion Q of the battery 12 on each state change or at any time upon receipt of a downlink-telemetry transmitted calculation and uplink transmit command UT Q. Alternatively, the counts $CCNT_1$-$CCNT_N$ accumulated in the RAM registers $REG_1$-$REG_N$ can be uplink telemetry transmitted to the external medical device upon receipt of a downlink-telemetry transmitted command UT CNT. In either case, the ERT of the battery 12 can then be estimated in the external medical device from the uplink-telemetry transmitted or external medical device calculated total charge depletion Q. The estimation of the battery ERT and an EOL date thus depends on VCO counts accumulated in memory for each current drain state.

In one variation of the preferred embodiment, all of the current-sensing resistors 30, 40, 50, 60 are coupled in parallel to the negative battery terminal upon initial power-up of the IMD circuitry, which typically occurs in the final stages of fabrication and testing of the IMD 10. The control and timing circuit includes power-up or power-on-reset circuitry or a software routine that is enabled on initial connection of the battery terminals to the IMD circuitry and that issues a POWER-UP command to the digital I/O switch network 76 causing it to provide switching signals on lines 34, 44, 54, 64 to simultaneously enable all of the FET switches 32, 42, 52, 62. In this way, the total current sense resistance load is less than the lowest current-sensing resistor resistance and facilitates proper power-up of the IMD 10.

Turning to the selection of the resistances of the current-sensing resistors 30, 40, 50, 60, it will be recalled that the battery 12 can be characterized as a voltage source in series with an internal resistance, and at least one of the current-sensing resistors 30, 40, 50, and 60 are in series with the internal resistance. As battery charge decreases, the voltage drop across the internal resistance increases, resulting in a decrease in battery terminal voltage $V_{BAT}$. The current-sensing resistor voltage drop $V_S$ subtracts from that terminal voltage $V_{BAT}$ that is available to the IMD operating system as well as MCU 70. The battery terminal voltage $V_{BAT}$ is applied to the VCO 28, so that the decrease in terminal voltage is taken into account, whereby the VCO output signal frequency $F_S$ varies both as a function of the battery terminal voltage $V_{BAT}$ and the selected current-sensing resistor voltage drop $V_S$ which is dependent on the current-sensing resistor resistance $R_S$ and the current drain state.

The resistances $R_S$ of the current-sensing resistors 30, 40, 50, 60 are selected as a function of the current consumption of the IMD 10 in each operating state of its cycle of operation. For example, assume that IMD 10 is an IPG that has at least three states in its operating cycle, which may be defined as the sequence of operations between deliveries of successive stimulation therapies. At the least, the operating states include a standby or "Quiescent" state, when operations are minimized and current drain is the lowest, a "Running" state when current drain is elevated from the Quiescent state in order to perform certain operations, e.g., powering a physiologic sensor and analyzing the sensor output signal or transacting a telemetry session, and a "Stimulating" state when a stimulation therapy is applied to body tissue. It will be understood that the operating state may be switched between the Quiescent and Running states a fixed or a variable number of times between successive Stimulating states, and the processing of the physiologic sensor output signal may trigger or postpone an operating change to the Stimulating state. The following table sets forth exemplary current drain or consumption in each state that would be determined by the particular IMD design:

TABLE I

| Mode | Current consumption |
| --- | --- |
| Quiescent | 10 µA |
| Running | 50 µA |
| Stimulating | 20 mA |

Resistances $R_S$ for each of the current-sensing resistors 34, 44, 54, for example are then selected to provide an adequate voltage amplitude of the $V_S$ input voltage applied to VCO 28. As noted above, a large resistance $R_S$ both reduces voltage available to the IMD operating system and consumes power that is lost to heat and decreases battery life. Generally speaking, it is desirable to limit the current-sensing resistor voltage drop $V_S$ to no more than one percent to ten percent of fresh battery terminal voltage $V_{BAT}$. The selected maximum voltage drop is, of course, design dependent. Moreover, the resistance $R_S$ should be selected to interface properly the VCO 28, so that the current-sensing resistor voltage drop $V_S$ falls within a suitable dynamic range that does not have to be amplified prior to being applied to the input of VCO 28.

For example, in the case of a 3.00 volt battery having a substantially flat discharge curve and IMD circuitry capable of functioning properly between 3.0 volts and 2.5 volts (the battery EOL voltage), it may be safe to select a maximum $V_S$=150 mV, providing 2.85 volts to the IMD circuitry. The nominal 150 mV voltage drop effectively raises the battery EOL voltage to 2.65 volts. The available battery charge in the steep knee of the discharge curve between 2.65 volts and 2.5 volts is relatively small. In accordance with one modification of the preferred embodiments described below, the charge count circuit 22 may be disabled and bypassed when $V_{BAT}$ falls to a specified threshold voltage, e.g., 2.70 volts, thereby enabling IMD operation to 2.5 volts EOL voltage.

In this case, the resistance $R_S$ of each resistor is chosen so as to ensure that the current-sensing resistor voltage drops $V_S$ is always less than 150 mV. Theoretically, one might select resistances for all of the current-sensing resistors correlated to the current drain states that result in an exact 150 mV voltage drop in each operating state to simplify the estimation of total charge consumption. Alternatively, standard resistance values for $R_S$ may be selected instead based on availability and current drain in each operating state as follows:

TABLE II

| Mode | Current consumption | Selected resistance $R_S$ | Voltage drop $V_S$ |
| --- | --- | --- | --- |
| Quiescent | 10 µA | 30 = 10,000 ohm | 100 mV |
| Running | 50 µA | 40 = 1,000 ohm | 50 mV |
| Stimulating | 20 mA | 50 = 5 ohm | 100 mV |

As can be seen in Table II, resistances $R_S$ are chosen in relation to the current drain or consumption so that the current-sensing resistor voltage drop $V_S$ does not exceed 150 mV in each current drain state. These selections of $R_S$ establish a dynamic range of 0 mV to about 150 mV depending on the actual current drain that may vary slightly from the nominal current state current drains determined for the design. Transient current drains that are too complex to measure and anticipate in the design phase may also exist. Actual current drain may also vary as a result of actual therapy being delivered for example one patient might need varying stimulation treatments. The narrow dynamic range simplifies the design of the VCO 28 and ensures reliable operation as battery terminal voltage decreases from the 3.00 V BOL battery voltage.

Turning to the estimation of the total charge depletion of battery 12, we first consider the operation of the VCO 28 and the counter 72, that is the relation between a voltage $V_S$ and the count CNT stored in counter 72 for the duration of each current-drain state. As described above, the output signal of the VCO 28 is a pulse train having a frequency $F_S$ directly related to the input signal voltage $V_S$, in accordance with $F_S = V_S * \text{Gain} = V_S * F_{BAT}/V_{BAT}$.

Accordingly, the state count CNT in counter 72 increments at $V_S/V_{BAT}*F_{BAT}$ every second. If the current drain state is sustained for T seconds, the count CNT in counter 72 advances by $F_S = V_S/V_{BAT}*F_{BAT}*T$. It should be noted that the counter frequency $F_{BAT}$ should be chosen so that $1/F_{BAT}$ is considerably shorter than shortest operating state duration. For example, if the lowest time duration operating state is "Running", perhaps only 20 milliseconds in duration, then the VCO frequency $F_{BAT}$ should be considerably higher than 50 Hz, e.g., 32 kHz. The total charge Q drawn from the battery 12 is equivalent to the cumulative current that has been drawn over time, that is, Q is the integral of I over T, which can further be estimated as a sigma instead of an integral $Q = \Sigma (I*T)$. In accordance with the present invention, an estimation of the total charge Q drawn from the battery 12 is effected that does not require storage of time T or cumulative current I.

The total charge Q is the sum of the accumulated state charges $Q_S$ drawn from the battery 12 in the N current-drain states as follows:

$$Q = \sum_{s=1}^{N} Q_s = \sum_{s=1}^{N} I_s \cdot \Delta T_s$$

where $I_S$ in each current drain state is equal to $V_S/R_S$ of that state, where $V_S$ is the voltage drop across the current-sensing resistor (applied as $V_S$ to the VCO input), and $R_S$ is the resistance of the current-sense resistor of state s. Over a given state duration $T_S$, the counter count $CNT = F_S * T_S$ or $V_S/V_{BAT}*F_{BAT}*T_S$. As described above, the current drain state count CNT in counter 72 is added to the appropriate cumulative current drain state count $CCNT_1$-$CCNT_N$ stored in the corresponding one of the RAM registers $REG_1$-$REG_N$. Each state charge Qs is proportional to each respective cumulative current drain state count $CCNT_1$-$CCNT_N$. The calculation of cumulative charge Q for the N current drain states reduces to:

$$Q = \sum_{s=1}^{N} \frac{V_S}{R_S} \cdot T_S$$

$$= \frac{V_{BAT}}{F_{BAT}} \cdot \sum_{s=1}^{N} \frac{V_S \cdot F_{BAT}}{R_S \cdot V_{BAT}} \cdot T_S$$

$$= \frac{V_{BAT}}{F_{BAT}} \cdot \sum_{s=1}^{N} \frac{CNT_S}{R_S}$$

$$A_S \equiv \frac{V_{BAT}}{F_{BAT} \cdot R_S}$$

$$= \frac{1}{\text{Gain} \cdot R_S} \Rightarrow Q$$

$$= \sum_{m=1}^{n} A_S \cdot CNT_S$$

where $A_S$ is a fixed value or coefficient for each current drain state based on the battery terminal voltage $V_{BAT}$, the fixed resistance $R_S$ and $F_{BAT}$, the VCO output signal frequency, if $V_S$ is set to $V_{BAT}$. Note that $V_{BAT}/F_{BAT}$ is the inverse of the fixed VCO gain or coefficient $\text{Gain} = F_{BAT}/V_{BAT}$ described above. Thus, the only variable in each current drain state is CNT, and the total charge Q drawn from the battery is a function of the fixed factor $A_S$ of each state and the time varying cumulative state counts $CCNT_1$-$CCNT_N$.

When the IMD 10 receives an uplink transmit command UT DATA from an external medical device, it can uplink telemetry transmit the computed value of total charge Q and/or the cumulative state counts $CCNT_1$-$CCNT_N$ stored in the corresponding RAM registers $REG_1$-$REG_N$ to the external medical device. In the latter case, the external medical device or programmer can make the estimation of total charge Q drawn from the battery.

Referring back to FIG. 1, it will be understood that modifications can be made that would directly increment the cumulative current drain state counts $CCNT_1$-$CCNT_N$ stored in the corresponding RAM registers $REG_1$-$REG_N$ during each operating state. For example, a further switch network could be substituted for the counter 72 and RAM register 74 that would switch the output of the VCO 28 directly to inputs of the correct RAM register, $REG_1$-$REG_N$ to increment the respective cumulative current drain state count $CCNT_1$-$CCNT_N$ during the operating state.

Figure 2:
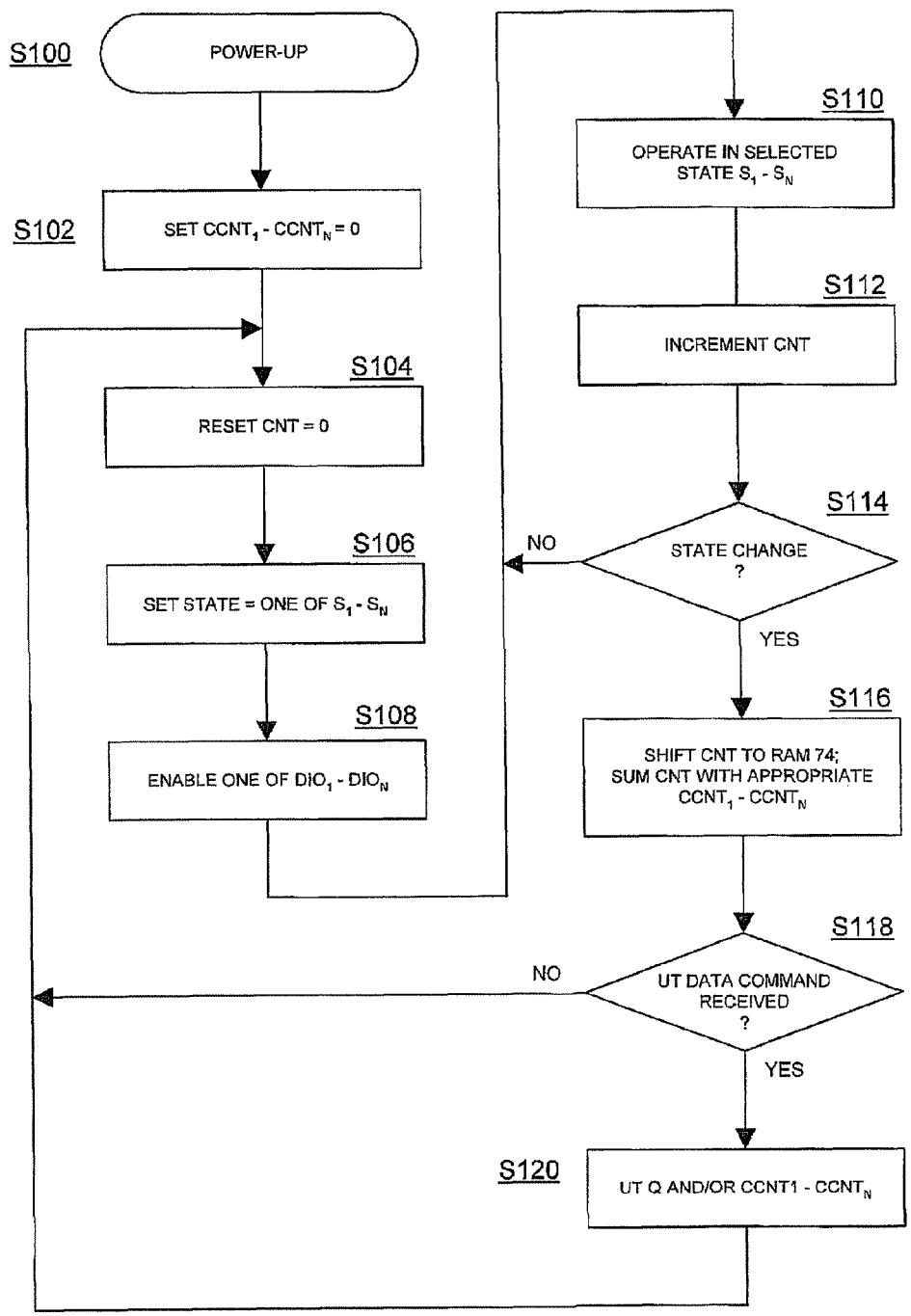
FIG. 2 is a flow chart illustrating the steps of operating the IMD of FIG. 1 to provide a measure of total charge drawn from the battery from which an estimation of battery remaining life may be made.

The flowchart of FIG. 2 summarizes the above-described operations in steps S100-S120. Steps S100-S102 set forth the initialization that takes place upon power-up. Steps S104-S116 illustrate the accumulation of the cumulative current drain state count $CCNT_1$-$CCNT_N$ during the subsequent operating states between power-up and battery EOL. Calculation of the total charge Q and optionally the ERT are not depicted inasmuch as they may be triggered to occur in a variety of ways in the IPG 100 or in an external medical device as described herein. At any time, the external medical device may issue a UT DATA command (step S118) prompting the uplink telemetry transmission of the computed value of total charge Q and/or the cumulative state counts $CCNT_1$-$CCNT_N$ in step S120. Step S118 may occur during step S110, and step S120 may be delayed to take place following step S116. Step S118 is performed during the next operating state and does not necessarily interrupt or delay operation in the next state per steps S104-S112.

Returning to FIG. 1, it may be desirable to disable and bypass the charge count circuit 22 when battery voltage $V_{BAT}$ decreases to a threshold voltage somewhat exceeding the EOL voltage upon which the battery 12 fails to power the IMD circuitry plus the maximum voltage drop $V_S$. A voltage monitor 80 and bypass FET switch 82 are optionally provided to monitor $V_{BAT}$ and to bypass the sense resistors 30, 40, 50, 60 when the threshold is met. For example, the threshold voltage may be set to 2.70 volts for the nominally 3.0 volt battery 12 described above. At that point in the battery life, there would be little value in continuing to increment the cumulative current drain state count $CCNT_1$-$CCNT_N$ charge counts. The disabling of the charge count circuit 22 enables use of the remaining battery charge to battery EOL. Alternatively, the voltage monitor 80 may be incorporated into the MCU 70 or the control and timing circuit 16 and provide the DISABLE signal to enable FET switch 82. It should be apparent that the POWER-UP signal may also be applied to the bypass FET switch 82 rather than to all of the FET switches 32, 42, 52, 62 during power up.

The charge drain monitoring circuitry and software of the present invention can be embodied in battery powered IPGs adapted to apply electrical stimulation through electrical medical leads to pelvic floor muscles and/or nerves to alleviate incontinence.

Incontinence is a condition characterized by involuntary loss of urine, beyond the individual's control, that results in the loss or diminution of the ability to maintain the urethral sphincter closed as the bladder fills with urine. Male or female stress urinary incontinence (SUI) occurs when the patient is physically or emotionally stressed.

One cause for this condition is damage to the urethral sphincter or loss of support of the urethral sphincter, such as can occur in males after prostatectomy or following radiation treatment, or that can occur due to pelvic accidents and aging related deterioration of muscle and connective tissue supporting the urethra. Other causes of male incontinence include bladder instability, over-flowing incontinence and fistulas.

The female's natural support system for the urethra is a hammock-like supportive layer composed of endopelvic fascia, the anterior vaginal wall, and the arcus tendineus (a distal attachment to the pubic bone). Weakening and elongation of the pubourethral ligaments and the arcus tendineus fascia pelvis, weakening of the endopelvic fascia and pubourethral prolapse of the anterior vaginal wall, and their complex interaction with intraabdominal forces are all suspected to play a role in the loss of pelvic support for the urethra and subsequent hypermobility to an unnaturally low non-anatomic position, leading to urinary incontinence.

Exemplary IMDs for treatment of urinary incontinence and neurogenic bladder dysfunction are disclosed, for example, in Biocontrol Medical Ltd. U.S. Pat. Nos. 6,354,991, 6,652,449, 6,712,772, and 6,862,480. The IMDs disclosed in the '991, '449, and '480 patents for treatment of both urinary stress incontinence and urge incontinence comprise a control unit (IPG) and electrical medical leads bearing one or more sensing/stimulation electrode and one or more physiologic sensor adapted to be implanted in selected sites of a patient's body. The sensing/stimulation electrode(s) is preferably implanted in the pelvic region of a patient so as to be in electrical contact with body tissue including one or more of the muscles that relax and contract in regulating urine flow from the bladder. The control unit is preferably implanted under the skin of the abdomen or genital region, and receives signals from the electrodes and/or from the sensors. Motion and/or pressure signals detected by the physiologic sensor(s) and/or electromyogram (EMG) signals appearing across the sensing/stimulation electrodes are conveyed to and analyzed by the control unit operating system in order to distinguish between signals indicative of urge incontinence and those indicative of stress incontinence. A particular pressure sensor design is disclosed in the above-referenced '772 patent. When impending stress incontinence is detected, the control unit generates and provides an electrical stimulation therapy having stimulation parameters configured to treat stress incontinence through the electrodes to the tissue. Similarly, urge incontinence is treated with intermittent electrical stimulation having stimulation parameters configured to treat urge incontinence.

In various configurations, the IMDs disclosed in the above-referenced Biocontrol Medical patents may be used alternatively or additionally to treat fecal incontinence, interstitial cystitis, urine retention, or other sources of pelvic dysfunction, pain or discomfort, by suitable modifications to the IMD.

Figure 3:
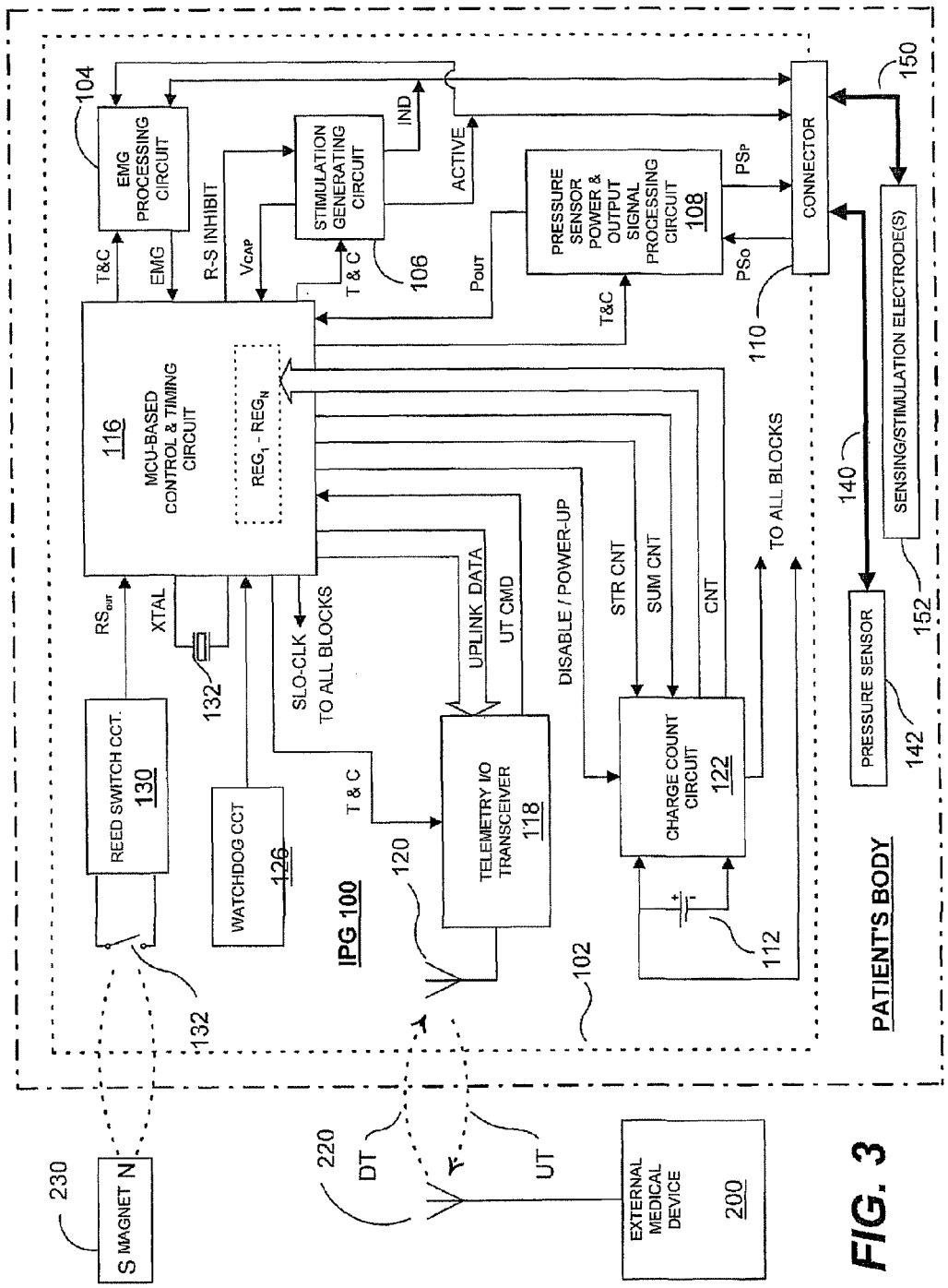
FIG. 3 is a simplified schematic diagram of a battery powered IMD adapted to be implanted in a patient's body incorporating the charge count circuit of FIG. 1 and operated in conjunction with external medical devices to provide the physician with the measure of total charge drawn from the battery from which an estimation of battery remaining life may be made.

Such an IMD adapted to deliver stimulation therapies in the pelvic region to treat such disorders is schematically depicted in FIG. 3 comprising an IPG 100 (within the dotted lines) coupled with electrical medical leads 140 and 150 implanted in a patient's body. The IPG 100 comprises a hermetically sealed housing 102 enclosing schematically depicted components of an IPG operating system and having an IPG connector 110 for making connection with proximal lead connectors of the electrical medical leads 140 and 150. It will be understood that the electrical medical leads 140 and 150 may be combined into a single electrical medical lead.

Operating modes and parameters of the IPG operating system may be interrogated or programmed using the external medical device 200. Optionally, the patient may be provided with a magnet 230 that the patient may apply against the skin overlying the IPG 100 to close a reed switch 132 of the IPG 100 to either trigger or inhibit delivery of electrical stimulation, depending on the nature of the therapy. For example, the operating system may respond to the magnetic field induced reed switch closure to inhibit delivery of electrical stimulation so the patient may voluntarily void.

The external medical device 200 may take the form of a personal computer having a display, printer, memory, an input device, e.g., a keyboard and mouse or screen pointer, an output coupled to the world-wide web, a CPU, and be controlled by hardware, firmware and software that enables two-way telemetry communication with the IPG 100. The external medical device 200 may be a programmer provided to the physician treating the patient for use when the patient is present. A limited function external medical device 200 may be provided to the patient to provide the patient with the ability to increase or decrease the intensity and/or duration of the stimulation. In addition, the limited function external medical device provided to the patient may also comprise a telemetry transceiver having the capability of receiving remotely transmitted commands from a medical center to generate and transmit the UT DATA command, receive the computed value of total charge Q and/or the cumulative state counts $CCNT_1$-$CCNT_N$, and communicate the data to the remote medical center. In either case, the telemetry communication link may take any of the known forms that provide uplink telemetry (UT) and downlink telemetry (DT) transmissions between IPG 100 and external medical device 200 transmitted between IPG antenna 120 and antenna 220, respectively, through the patient's skin. Any of the IMD/programmer telemetry protocols and formats may be employed.

As indicated in the above-referenced Biocontrol Medical patents, physiologic sensors that generate signals responsive to, for example, motion, intravesical or abdominal pressure, or urine volume in the bladder may be useful in indicating some forms of incontinence. Typically, when the urine volume in the bladder is low, there will be no urine flow even when the abdominal pressure does increase. As described in detail, the control unit preferably processes the signals from the various sensors and uses them to determine when the electrical stimulation should be applied to the muscles to inhibit urine flow.

In FIG. 3, the physiologic sensor is denoted as a pressure sensor 142 supported in the body by the electrical medical lead 140. Electrical medical lead 140 comprises at least one electrically insulated conductor extending between a distal pressure sensor 142, for example, and a proximal lead connector adapted to be coupled to the IPG connector 110 in a manner well known in the art. The pressure sensor 142 may take the form of the pressure sensor disclosed in the above-referenced Biocontrol Medical patents, particularly the above-referenced '772 patent.

The electrical medical lead 150 delivers electrical stimulation and preferably senses the EMG and may be configured as a unipolar, bipolar or multi-polar lead. A unipolar lead 150 comprises one electrically insulated conductor extending between one distal sensing/stimulation electrode and a proximal lead connector adapted to be coupled to the IPG connector 110 in a manner well known in the art. A bipolar or multi-polar lead 150 comprises at least two electrically insulated conductors extending between spaced apart distal sensing/stimulation electrodes 152 and a proximal lead connector adapted to be coupled to an IPG connector 110 in a manner well known in the art. Leads 140 and 150 may be combined into a single electrical medical lead or the pressure sensing lead 140 may also be configured to provide electrical sensing and/or stimulation.

As described in the above-referenced Biocontrol Medical patents, the lead bodies of the electrical medical leads 140 and 150 may be about 5-10 cm long. The sensing/stimulation electrode(s) 152 are preferably formed of platinum-iridium or nickel-chromium alloy and may be in the shape of flexible, intramuscular-type, wire electrodes that may be about 1-5 long and 50-100 microns in diameter to minimize patient discomfort. It will be understood that a fixation mechanism may be incorporated into the lead bodies of the electrical medical leads 140 and 150 to retain the pressure sensor 142 and/or sensing/stimulation electrode(s) 152 at selected sites. For example, the sensing/stimulation electrodes 142 may be formed in the shape of a spiral or hook, as is known in the art, so that they can be easily and permanently anchored in the muscle. The IPG 100 and lead 150 may provide unipolar or bipolar stimulation of the body tissue in locations disclosed in the above-referenced Biocontrol Medical patents, for example. Particular techniques for implanting the leads 140 and 150 or an electrical medical lead combining the physiologic sensor with the sensing/stimulation electrodes are disclosed in the above-referenced Biocontrol Medical patents.

As shown in FIG. 3, the sensing/stimulation electrode(s) 152 of lead 150 are coupled by lead conductors and the IPG connector 110 to the ACTIVE and indifferent (IND) input(s) of an EMG processing circuit 104. If the IPG 100 is configured for unipolar sensing and stimulation, then the IND input/output line is coupled to the conductive housing 102 encasing the components of the IPG 100 other than the IPG connector 110 and, in certain cases, the antenna 120. The EMG processing circuit 116 may simply take the form of an amplification stage that outputs the EMG signal for reasons explained in the above-referenced Biocontrol Medical patents.

The IPG 100 may take any of the known forms that can be programmed to provide therapy stimulation taking the form of single pulses or pulse bursts separated by interpulse periods, wherein the pulse energy, including pulse width and amplitude, and the burst frequency, number of pulses in the burst, and the interpulse period may be remotely programmed by a physician employing external medical device 200. A number of stimulation regimens for treating various forms of incontinence are set forth in the above-referenced Biocontrol Medical patents. Generally speaking, a stimulation cycle of the type described above with respect to FIG. 1 is established involving repetitive state changes between low, medium and high current drain states. The stimulation generating circuit 106 draws charge from the battery 112 to generate the stimulation regimen dictated by the IPG operating system, particularly the operating system algorithm embodied in memory, firmware and software within the micro-controller unit (MCU) based control and timing circuit 116. The MCU-based control and timing circuit 116 times out the operating states/current drain states of a given stimulation cycle and triggers state changes either on time-out or when interrupted by changes in input signals, including processed changes in pressure and EMG signals.

The sensing/stimulation electrode(s) 152 of lead 150 are coupled by the lead conductors through the IPG connector 110 to the output(s) of the stimulation generating circuit 106. As described in the above-referenced Biocontrol Medical patents, stimulation generating circuit 106 comprises a DC/DC converter, as is known in the art, and a capacitor, which is charged by the DC/DC converter to a stepped-up voltage level $V_{CAP}$ regardless of the precise battery voltage of battery 112, which may vary between 3.2 and 2.2-2.5 volts. The same DC/DC converter, or another similar device, preferably supplies power to other circuit components of IPG 100. The stepped up voltage is discharged through the sensing/stimulation electrodes to stimulate tissue. As noted above, stimulation may be inhibited by the output signal $RS_{OUT}$ of a reed switch circuit 130 when the patient closes the reed switch 132. The inhibition signal R-S INHIBIT may persist to interrupt the high current drain, stimulation delivery state for a time period set by the MCU-based control and timing circuit 116. Alternatively, the reed switch 132 may be directly incorporated into the stimulation generating circuit 106 to directly inhibit stimulation when the magnetic field closes (or opens) the reed switch 132.

The MCU-based control and timing circuit 116 comprises one or more signal amplifier, A/D converter, and D/A converter as well as RAM registers for temporary and permanent data storage, counters, data buses, and interconnecting circuits. As described below, the MCU-based control and timing circuit 116 also comprises a CPU able to be driven by low-speed and high-speed clocks. A mixture of hardware, firmware and software processes the operating algorithm with operating parameters programmed into RAM employing the external medical device 200 and the telemetry I/O transceiver 118 operating in the fashion of telemetry transceiver 118 described above. A watchdog circuit 126 monitors the status of the system and resets the system to a start-up state if an error is detected.

Timing and control functions of the MCU-based control and timing circuit 116 are governed in part by one or more system clocks. As disclosed in the above-referenced Biocontrol Medical patents, the MCU-based control and timing circuit 116 preferably comprises a low-speed CPU or processor and a high-speed CPU or processor or a combined low-speed and high-speed CPU or processor.

The crystal 132 provides an accurate 32768 Hz slow clock that times the operation of the EMG processing circuit 104, the pressure sensor power and output signal processing circuit 108, and the low-speed processor to continuously monitor the EMG signal and apply power $PS_P$ to the pressure sensor 142 and process the pressure output signal $PS_O$. The slow clock rate significantly reduces consumption of battery charge during the sensing state and any other quiescent or standby states. A high-speed, e.g., 2 MHz, clock may be developed by the MCU-based control and timing circuit 116 from an RC circuit.

When the low-speed processor detects a change in the EMG signal and/or the pressure output signal $PS_O$ during the time-out of a low current drain sensing state satisfying criteria signifying an imminent incontinence event, the fast clock is generated and applied to an A/D converter and the high-speed processor. The high-speed processor performs an accurate analysis of the EMG and pressure signals to determine whether stimulation is actually warranted. The high-speed processor is programmed to distinguish between signals indicative of possible incontinence and other signals that do not warrant stimulation to inhibit urine flow. In particular, the high-speed processor is preferably programmed to recognize signal patterns indicative of normal voiding, and does not trigger stimulation of the muscles when such patterns occur, so that the patient can pass urine normally.

Preferably, the high-speed processor analyzes both long-term and short-term variations in the signals, as well as rates, spectral patterns, and patterns of change in the signals. For example, to inhibit stress incontinence, the high-speed processor may set a threshold of an aspect of the EMG signal that varies over time responsive to an assessment of the patient's physiological condition. Subsequently, a stimulation therapy is initiated only when a transient variation in the aspect of the EMG signal exceeds the threshold.

The IPG 100 may also be programmable to deliver a chronic stimulation regimen to counter urge incontinence. In such an urge incontinence mode, stimulation is delivered for the duration of an on-time and each successive stimulation therapy is separated by a quiescent off-time that is typically longer than the on-time. Thus, at least two current drain states are defined in such a chronic stimulation mode.

A stimulation delivery state is entered when the applicable incontinence criteria are satisfied or optionally when the sensing state times out without being interrupted by satisfaction of the applicable incontinence criteria (which correlates to chronic stimulation for urge incontinence). In the stimulation current drain or operating state, the stimulation generating circuit 106 is operated by the MCU-based control and timing circuit 116 to generate and deliver a stimulation therapy regimen. Switches in the EMG processing circuit 104 are opened to isolate the IND and ACTIVE sensing/stimulation electrodes during delivery of a stimulation therapy regimen. Similarly, the pressure sensor power and output signal processing circuit 108 is instructed to halt applying power $PS_P$ to the pressure sensor 142 and processing the pressure output signal $PS_O$ for the duration of the stimulation state.

In one example disclosed in the above-referenced Biocontrol Medical patents, the entire sequence of signal detection and processing is estimated to take between 5 and 20 ms, up to the point at which the high-speed processor reaches a decision as to whether or not to trigger delivery of a stimulation therapy. The application of the stimulation therapy commences between 1 and 20 ms after the decision is reached, with the result that contraction of the pelvic muscles begins within 15-50 ms of an onset of increased EMG activity indicating impending urine loss. The stimulation pulse amplitude, width and number of delivered pulses, dictating the stimulation duration, may be programmable by the physician. Alternatively or additionally, stimulation is terminated if the patient voids voluntarily or other new data indicate that the expected incontinence is no longer likely. Stimulation is resumed if possible incontinence is again detected.

Thus, at least three operating states may be defined that recur periodically and exhibit differing current drain states. The sensing state and the therapy delivery state durations may vary, whereas the signal processing state may be relatively constant in duration. The rate of discharge of the battery 112 therefore depends on the current drain in each current drain or operating state and the durations of the states. The battery 112 may comprise a primary battery (non-rechargeable) and/or a rechargeable battery. Preferably, battery 112 comprises a standard primary IMD battery, such as a lithium-iodine battery, having a nominal output of 3.0 volts.

As described above with respect to FIG. 1, certain of the RAM registers of the MCU-based control and timing circuit 116 are designated as the $REG_1$-$REG_N$ registers. As in FIG. 1, a charge count circuit 122 operating under the control of the MCU-based timing and control system 116 as a battery charge depletion monitor is provided for monitoring the amount of charge delivered by the battery 112 of the IPG 100 when operating in a plurality of current drain states. The charge count circuit 122 of FIG. 3 takes the form of the charge count circuit 22 of FIG. 1, and the MCU-based timing and control system 116 issues the POWER-UP, STATE, and SUM CNT commands controlling the switching of the correct one of the current sensing resistors 30, 40, 50, 60 into series with the battery 112, accumulation of CNT in each current drain state, and the addition of the CNT with the appropriate one of the cumulative charge counts $CCNT_1$-$CCNT_N$. Referring again to FIG. 2, it illustrates the steps of accumulating the cumulative charge counts $CCNT_1$-$CCNT_N$ in IPG 100.

Cumulative charge counts $CCNT_1$-$CCNT_N$ accumulated in the RAM registers $REG_1$-$REG_N$ over the operating states can be employed to estimate the total charge depletion Q of the battery 112 on each state change or at any time upon receipt of a downlink-telemetry transmitted calculation and uplink transmit command UT Q. Alternatively, the counts $CCNT_1$-$CCNT_N$ accumulated in the RAM registers $REG_1$-$REG_N$ can be uplink telemetry transmitted to the external medical device 200 upon receipt of a downlink-telemetry transmitted command UT CNT. In either case, the ERT of the battery 112 can then be estimated in the external medical device 200 from the uplink-telemetry transmitted or medical device calculated total charge depletion Q. The estimation of the battery ERT and an EOL date thus depends on VCO counts accumulated in memory for each current drain state.

All patents and publications referenced herein are hereby incorporated by reference in their entireties.

It will be understood that certain of the above-described structures, functions and operations of the above-described preferred embodiments are not necessary to practice the present invention and are included in the description simply for completeness of an exemplary embodiment or embodiments. It will also be understood that there may be other structures, functions and operations ancillary to the typical surgical procedures that are not disclosed and are not necessary to the practice of the present invention.

In addition, it will be understood that specifically described structures, functions and operations set forth in the above-referenced patents can be practiced in conjunction with the present invention, but they are not essential to its practice.

It is therefore to be understood, that within the scope of the appended claims, the invention may be practiced otherwise than as specifically described without actually departing from the spirit and scope of the present invention.

The invention claimed is:

1. A system comprising:
   an implantable battery;
   an implantable medical device powered by the battery, the device having first and second current drain states; and
   a first resistance connected to the battery through a first current path when the device is in the first current drain state, wherein current is prevented from flowing through the first current path when the device is in the second current drain state;
   a second resistance connected to the battery through a second current path when the device is in the second current drain state, wherein current is prevented from flowing through the second current path when the device is in the first current drain state;
a first memory register configured to store a cumulative first current drain state count indicative of total charge drawn from the battery when the device is in the first current drain state; and
a second memory register configured to store a cumulative second current drain state count indicative of a total charge drawn from the battery when the device is in the second current drain state.

2. The system of claim 1, wherein:
the system comprises a voltage-controlled oscillator (VCO) having an input, an output and a VCO signal at the output having a frequency that is proportional to a signal applied to the input; and
the first and second resistances are electrically coupled to the input;
a first voltage is generated at the input responsive to a first current passing through the first resistance along the first current path when the device is in the first current drain state; and
a second voltage is generated at the input responsive to a second current passing through the second resistance along the second current path when the device is in the second current drain state.

3. The system of claim 2, comprising a counter at the output of the VCO, wherein:
the counter is configured to count the VCO signals;
generate a first current drain count while the device is in the first current drain state; and
generate a second current drain count while the device is in the second current drain state.

4. The system of claim 3, wherein:
the first memory register updates the cumulative first current drain state count responsive to the first current drain count generated by the counter; and
the second memory register updates the cumulative second current drain state count responsive to the second current drain count generated by the counter.

5. The system of claim 1, further comprising:
a first switch in series with the first resistance and the first current path, the first switch having a closed state, in which the first current travels through the first resistance and the first current path, and an open state, in which current is prevented from traveling through the first resistance and the first current path; and
a second switch in series with the second resistance and the second current path, the second switch having a closed state, in which the second current travels through the second resistance and the second current path, and an open state, in which current is prevented from traveling through the second resistance and the second current path.

6. The system of claim 5, further comprising switching circuitry coupled to the first and second switches, wherein the switching circuitry is configured to place the first switch in the closed state and the second switch in the open state when the device is in the first current drain state, and the switching circuitry is configured to place the first switch in the open state and the second switch in the closed state when the device is in the second current drain state.

7. The system of claim 1, further comprising a telemetry transceiver adapted to transmit the cumulative first current drain state count and the cumulative second current drain state count.

8. A battery charge depletion monitor for monitoring an amount of charge delivered by a battery of an implantable medical device operable in at least first and second current drain states, the monitor comprising:
a voltage-controlled oscillator (VCO) having an input, an output and a VCO signal at the output having a frequency that is proportional to a signal applied to the input;
a counter coupled to the output and configured to count the VCO signals;
a first resistance coupled to the input;
a first switch coupled to the battery and the first resistance, the first switch having a closed state, in which current can travel from the battery through the first resistance, and an open state, in which current is prevented from traveling through the first resistance;
a second resistance coupled to the input; and
a second switch coupled to the battery and the second resistance, the second switch having a closed state, in which current can travel from the battery through the second resistance, and an open state, in which current is prevented from traveling through the second resistance.

9. The monitor of claim 8, further comprising switching circuitry coupled to the first and second switches, wherein the switching circuitry is configured to place the first switch in the closed state and the second switch in the open state when the device is operated in the first current drain state, and the switching circuitry is configured to place the first switch in the open state and the second switch in the closed state when the device is in the second current drain state.

10. The monitor of claim 8, further comprising:
a first memory register storing a cumulative first current drain state count indicative of total charge drawn from the battery when the device is in the first current drain state; and
a second memory register storing a cumulative second current drain state count indicative of a total charge drawn from the battery when the device is in the second current drain state.

11. A method of monitoring an amount of charge drawn from a battery of a device operable in at least first and second current drain states comprising:
operating the device in the first current drain state;
during operating the device in the first current drain state:
connecting a first resistance in series with the battery;
conducting a first current through the first resistance responsive to connecting a first resistance; and
generating a first current drain state count responsive to the first current;
operating the device in the second current drain state; and
during operating the device in the second current drain state:
connecting a second resistance in series with the battery;
conducting a second current through the second resistance responsive to connecting a second resistance; and
generating a second current drain state count responsive to the second current.

12. The method of claim 11, further comprising:
summing the first current drain state count with a cumulative first current drain state count; and
summing the second current drain state count with a cumulative second current drain state count.

13. The method of claim 12, further comprising calculating a total charge drawn from the battery as a function of the cumulative first current drain state count and the cumulative second current drain state count.

14. The method of claim 12, further comprising wirelessly transmitting the cumulative first current drain state count and the second cumulative current drain state count.

15. The method of claim 12, wherein summing the first current drain state count and summing the second current drain state count respectively occur responsive to transitioning the device from operating in the first current drain state to operating in the second current drain state, and from operating in the second current drain state to operating in the first current drain state.

16. The method of claim 11, wherein generating a first current drain state count responsive to the first current comprises:
  applying a voltage generated at the first resistance responsive to the first current to an input of a voltage-controlled oscillator (VCO); and
  counting pulses of a VCO signal generated at an output of the VCO.

17. The method of claim 16, wherein generating a second current drain state count responsive to the second current comprises:
  applying a voltage generated at the second resistance responsive to second first current to an input of a voltage-controlled oscillator (VCO); and
  counting pulses of a VCO signal generated at an output of the VCO.

18. The method of claim 11, further comprising calculating a total charge drawn from the battery as a function of the first and second current drain state counts and the first and second resistances.

19. The method of claim 11, further comprising treating a medical condition of a patient while operating the device in at least one of the first and second current drain states.

20. The method of claim 11, wherein:
  preventing current from traveling through the second resistance during operating the device in the first current drain state; and
  preventing current from traveling through the first resistance during operating the device in the second current drain state.

* * * * *

UNITED STATES PATENT AND TRADEMARK OFFICE
CERTIFICATE OF CORRECTION

PATENT NO. : 8,200,444 B2
APPLICATION NO. : 12/593787
DATED : June 12, 2012
INVENTOR(S) : Vaingast Page 1 of 1

It is certified that error appears in the above-identified patent and that said Letters Patent is hereby corrected as shown below:

Column 22, line 2, after "to", insert --the--, after "second", delete "first".

Signed and Sealed this
Twenty-seventh Day of November, 2012

David J. Kappos
*Director of the United States Patent and Trademark Office*